(12) United States Patent
Wu et al.

(10) Patent No.: US 9,203,038 B2
(45) Date of Patent: Dec. 1, 2015

(54) ELECTRONIC DEVICE

(71) Applicant: Samsung Electronics Co., Ltd., Suwon-Si, Gyeonggi-Do (KR)

(72) Inventors: Yiliang Wu, Oakville (CA); Anthony J. Wigglesworth, Oakville (CA); Ping Liu, Mississauga (CA); Nan-Xing Hu, Oakville (CA)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/527,027

(22) Filed: Oct. 29, 2014

(65) Prior Publication Data

US 2015/0053961 A1    Feb. 26, 2015

Related U.S. Application Data

(62) Division of application No. 13/158,584, filed on Jun. 13, 2011, now Pat. No. 8,963,131.

(51) Int. Cl.
| H01L 29/08 | (2006.01) |
| H01L 29/04 | (2006.01) |
| H01L 51/00 | (2006.01) |
| H01L 51/05 | (2006.01) |

(52) U.S. Cl.
CPC ........ *H01L 51/0074* (2013.01); *H01L 51/0012* (2013.01); *H01L 51/0035* (2013.01); *H01L 51/0545* (2013.01); *H01L 51/0558* (2013.01); *H01L 51/0541* (2013.01)

(58) Field of Classification Search
CPC ............ H01L 51/0074; H01L 51/0545; H01L 51/0035
USPC ............... 257/40; 438/148; 524/84; 549/381; 313/504
See application file for complete search history.

(56) References Cited

U.S. PATENT DOCUMENTS

| 7,378,135 | B2 | 5/2008 | Saigusa et al. | |
| 2008/0277648 | A1 | 11/2008 | Wakita | |
| 2010/0227956 | A1* | 9/2010 | Brown et al. | 524/84 |
| 2010/0244000 | A1* | 9/2010 | Tanaka et al. | 257/40 |
| 2011/0111173 | A1 | 5/2011 | Ogawa et al. | |

FOREIGN PATENT DOCUMENTS

| JP | 2009283786 A | 12/2009 |
| JP | 2009283786 A * | 12/2009 |

* cited by examiner

*Primary Examiner* — Julio J. Maldonado
*Assistant Examiner* — Moazzam Hossain
(74) *Attorney, Agent, or Firm* — Harness, Dickey & Pierce

(57) ABSTRACT

An electronic device, such as a thin-film transistor, includes a semiconducting layer formed from a semiconductor composition. The semiconductor composition comprises a polymer binder and a small molecule semiconductor. The semiconducting layer has been deposited on an alignment layer that has been aligned in the direction between the source and drain electrodes. The resulting device has increased charge carrier mobility.

2 Claims, 3 Drawing Sheets

ELECTRONIC DEVICE

CROSS-REFERENCE TO RELATED APPLICATIONS

This application is a divisional application of U.S. application Ser. No. 13/158,584 filed on Jun. 13, 2011 the entire contents of which is hereby incorporated herein by reference.

BACKGROUND

The present disclosure relates to thin-film transistors (TFTs) and/or other electronic devices comprising a semiconducting layer and an alignment layer. The alignment layer is used to increase the charge carrier mobility of the transistor and/or electronic device. High mobility and excellent stability may be achieved.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility (also referred to as the charge carrier mobility) and the current on/off ratio of the overall transistor. High mobility and high on/off ratio are desired.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like. To enable the use of these solution-based processes in fabricating thin-film transistor circuits, solution processable materials are therefore required. However, organic or polymeric semiconductors formed by solution processing tend to suffer from limited solubility, air sensitivity, and especially low field-effect mobility.

It would be desirable to develop new techniques to increase the field effect mobility of such semiconductors.

BRIEF DESCRIPTION

The present application discloses, in various embodiments, electronic devices and processes for making such electronic devices. The electronic devices include a semiconducting layer and an alignment layer. It is believed that the alignment layer induces microscopic and/or macroscopic alignment of the semiconducting layer.

Disclosed in embodiments is an electronic device comprising: a semiconducting layer comprising a small molecule semiconductor and a polymer binder; and an alignment layer in contact with the semiconductor layer.

The alignment layer may have a thickness of from about 0.2 nanometers to about 1 micrometer.

The alignment layer may be formed from a polyimide, a poly(vinyl cinnamate), an azobenzene polymer, a styrene-based polymer, or an organosilane agent of Formula (A):

$$(L)_t\text{-}[SiR_m(R')_{4-m-t}]_v \quad \text{Formula (A)}$$

wherein R is alkyl or aryl; R' is halogen or alkoxy; m is an integer from 1 to 4; L is a linking atom; t is 0 or 1; and v indicates the number of trisubstitutedsilyl groups on the linking atom.

In embodiments, the small molecule semiconductor may be a liquid crystalline compound.

The small molecule semiconductor may have the structure of Formula (I):

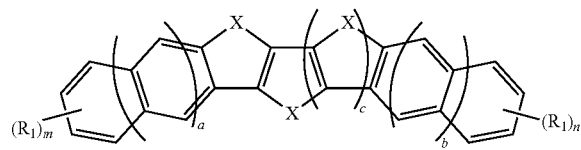

Formula (I)

wherein each $R_1$ is independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; m and n are the number of $R_1$ sidechains on their respective phenyl or naphthyl ring, and are independently an integer from 0 to 6; X is selected from the group consisting of O, S, and Se; and a, b, and c are independently 0 or 1.

The small molecule semiconductor could have the structure of Formula (II):

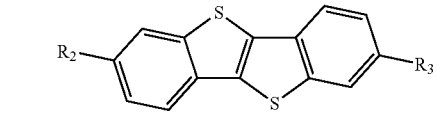

Formula (II)

wherein $R_2$ and $R_3$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen.

The small molecule semiconductor may have the structure of Formula (III):

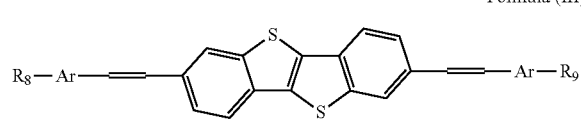

Formula (III)

wherein $R_8$, and $R_9$ are independently alkyl or substituted alkyl; and each Ar is independently an arylene or heteroarylene group.

The small molecule semiconductor could have the structure of Formula (IV):

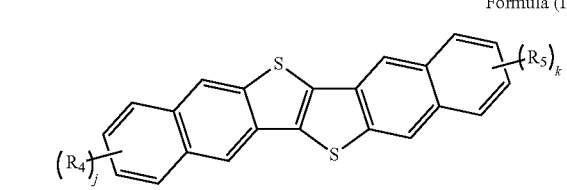

Formula (IV)

wherein $R_4$ and $R_5$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; and j and k are independently an integer from 0 to 6.

The small molecule semiconductor may have the structure of Formula (V):

Formula (V)

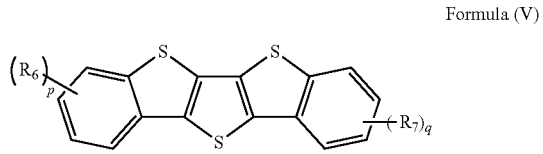

wherein $R_5$ and $R_7$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; and p and q are independently an integer from 0 to 4.

Alternatively, the small molecule semiconductor may have the structure of Formula (VI):

Formula (VI)

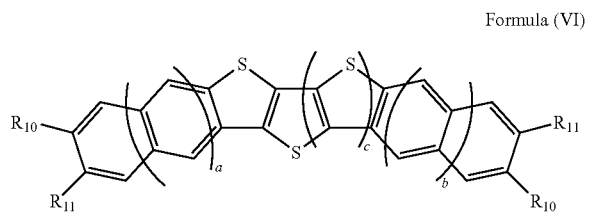

wherein $R_{10}$ and $R_{11}$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; and a, b, and c are independently 0 or 1.

The polymer binder may be a styrene-based polymer or an arylamine-based polymer. In specific embodiments, the polymer binder is polystyrene, poly(α-methyl styrene), poly(4-methyl styrene), poly(alpha-methyl styrene-co-vinyl toluene), poly(styrene-block-butadiene-block-styrene), polystyrene-block-isoprene-block-styrene), poly(vinyl toluene), a terpene resin, poly(styrene-co-2,4-dimethylstyrene), poly(chlorostyrene), poly(styrene-co-α-methyl styrene), poly(styrene-co-butadiene), polycarbazole, a polytriarylamine, or poly(N-vinylcarbazole). The polymer binder may alternatively be a styrene-based polymer having a weight average molecular weight of from about 40,000 to about 2,000,000.

The weight ratio of the small molecule semiconductor to the polymer binder may be from about 99:1 to about 1:3.

Also disclosed in embodiments is a thin film transistor comprising: a gate electrode, a source electrode, a drain electrode, a gate dielectric layer, a semiconductor layer, and an alignment layer. The source electrode and the drain electrode define a transistor channel. The semiconducting layer comprises a small molecule semiconductor and a polymer binder. The alignment layer is in contact with the semiconductor layer; wherein the small molecule semiconductor is aligned along the direction of the transistor channel direction.

The transistor comprising the alignment layer may have a field-effect mobility of at least 0.8 cm²V/·sec.

In particular embodiments, the alignment layer is located between the semiconductor layer and the gate dielectric layer.

Also disclosed is a method for forming an electronic device. Generally, the alignment layer, semiconducting layer, source electrode, and drain electrode are deposited on the substrate in whatever order is needed to form the desired device. The alignment layer is aligned in a transistor channel direction between the source electrode and the drain electrode at some point during the formation of the electronic device. The semiconducting layer is deposited on the alignment layer after this alignment process. The source electrode and the drain electrode define a transistor channel.

The alignment layer may be aligned by rubbing the aligning layer in the transistor channel direction, between the source electrode and the drain electrode. Alternatively, the alignment layer is formed from a polyimide, a poly(vinyl cinnamate), or an azobenzene polymer; and the alignment layer is aligned by irradiating the alignment layer with linearly polarized light.

In particular embodiments, the alignment layer is deposited upon a dielectric layer, the alignment layer is subsequently aligned, and the semiconducting layer is subsequently deposited upon the alignment layer.

Also disclosed in embodiments is an electronic device comprising: a source electrode and a drain electrode; an alignment layer having a first surface and a second surface; and a semiconducting layer deposited on a first surface of the alignment layer. The first surface was aligned in a direction between the source electrode and the drain electrode prior to the deposition of the semiconducting layer.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
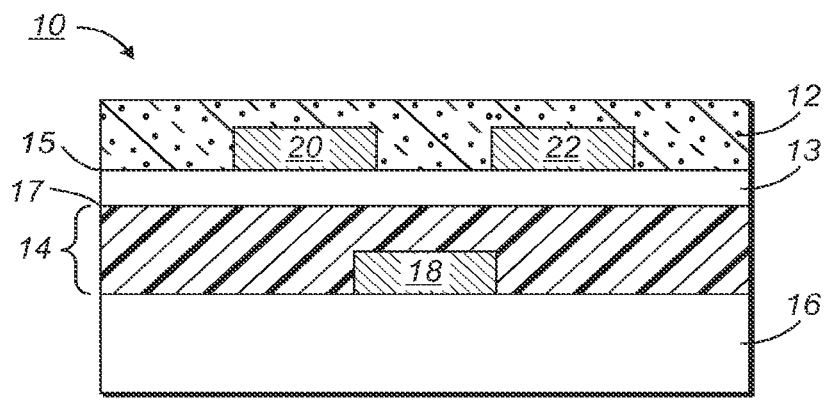
FIG. 1 is a diagram of a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The present disclosure relates to electronic devices, such as thin film transistors (TFTs), comprising an alignment layer and a semiconducting layer comprising a polymer binder and a small molecule semiconductor. The alignment layer is used to increase the field effect mobility of the electronic device.

FIG. 1 illustrates a bottom-gate bottom-contact TFT configuration according to the present disclosure. The TFT 10 comprises a substrate 16 in contact with the gate electrode 18 and a gate dielectric layer 14. The gate electrode 18 is depicted here atop the substrate 16, but the gate electrode could also be located in a depression within the substrate. The gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22. An alignment layer 13 is located between the dielectric layer 14 and the semiconducting layer 12. A first surface 15 of the alignment layer directly contacts the semiconducting layer 12. A second surface 17 of the alignment layer directly contacts the dielectric layer 14.

Figure 2:
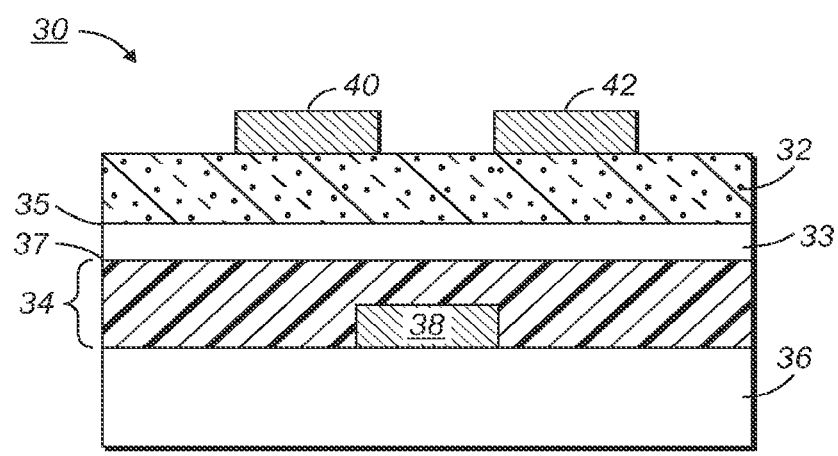
FIG. 2 is a diagram of a second embodiment of a TFT according to the present disclosure.

FIG. 2 illustrates another bottom-gate top-contact TFT configuration according to the present disclosure. The TFT 30 comprises a substrate 36 in contact with the gate electrode 38 and a gate dielectric layer 34. An alignment layer 33 is placed on top of the gate dielectric layer 34. A second surface 37 of the alignment layer directly contacts the dielectric layer 34. The semiconducting layer 32 is deposited upon a first surface 35 of the alignment layer 33. The semiconducting layer also separates the dielectric layer 34 from the source and drain electrodes 40 and 42.

Figure 3:
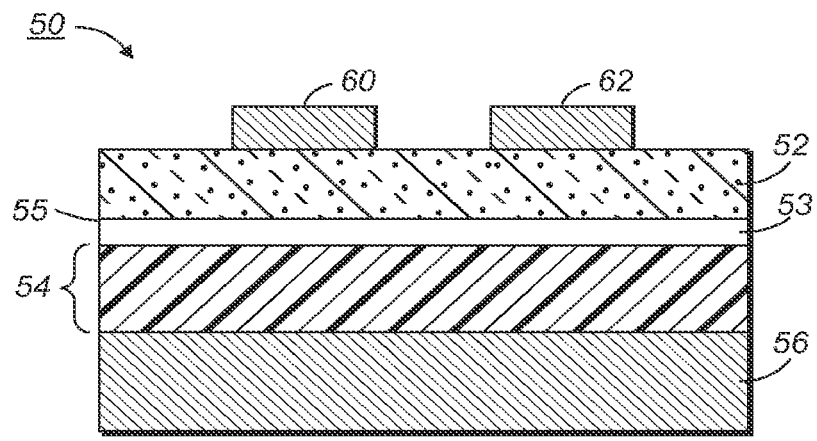
FIG. 3 is a diagram of a third embodiment of a TFT according to the present disclosure.

FIG. 3 illustrates a bottom-gate bottom-contact TFT configuration according to the present disclosure. The TFT 50 comprises a substrate 56 which also acts as the gate electrode and is in contact with a gate dielectric layer 54. An alignment layer 53 is placed on top of the gate dielectric layer 54. The source electrode 60, drain electrode 62, and semiconducting layer 52 are located atop the alignment layer 53. A first surface 55 of the alignment layer directly contacts the semiconducting layer 52.

Figure 4:
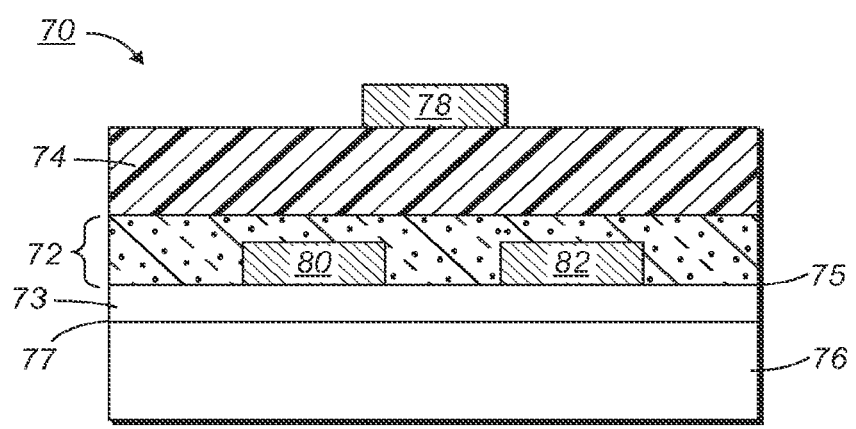
FIG. 4 is a diagram of a fourth embodiment of a TFT according to the present disclosure.

FIG. 4 illustrates a top-gate top-contact TFT configuration according to the present disclosure. The TFT 70 comprises a substrate 76. An alignment layer 73 is located upon the substrate 76 between the substrate 76 and the semiconducting layer 72. A first surface 75 of the alignment layer directly contacts the semiconducting layer 75. A second surface 77 of the alignment layer directly contacts the substrate 76. The alignment layer is also in contact with the source electrode 80 and the drain electrode 82. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72.

Figure 5:
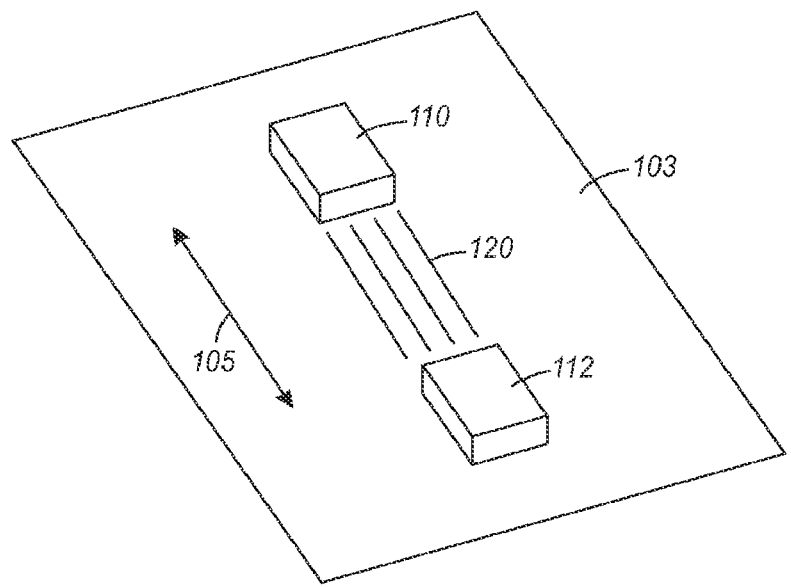
FIG. 5 is a perspective view showing certain aspects of the alignment layer.

It has been found that using the alignment layer increases the field effect mobility dramatically. It is believed that this increase is due to the alignment of the semiconductor layer along the transistor channel direction which is induced by the alignment layer. The chemical composition of the alignment layer itself is not necessarily significant. FIG. 5 is a perspective view of an embodiment similar to that of FIG. 1. The alignment layer 103 is visible. A source electrode 110 and a drain electrode 112 are located upon the alignment layer. The direction between the source electrode 110 and the drain electrode 112 is indicated by arrow 105, or put another way arrow 105 indicates a direction from the source electrode 110 to the drain electrode 112. The surface of the alignment layer is aligned in the direction indicated by arrow 105. This direction can also be referred to as the transistor channel direction. In a cyclic electrode where one electrode is surrounded by the other electrode with a semiconducting layer having an annular shape between the two electrodes, the transistor channel direction would be in the radial direction. This alignment occurs at least in the transistor channel between the source electrode and the drain electrode, and is indicated by lines 120. For example, the alignment begins at one of the electrodes and ends at one of the electrodes.

This alignment effect can be achieved by mechanical means or by indirect means. An example of a mechanical treatment is by rubbing the surface of the alignment layer upon which the semiconducting layer will be deposited. This mechanical rubbing may be performed with a rubbing cloth comprising a material such as rayon, cotton, or polyamide. The rubbing cloth can be wound around a roller which is used to perform the rubbing. An example of an indirect treatment is irradiating the alignment layer with linearly polarized light between the source and drain electrodes. The alignment treatment should be performed, at a minimum, in the area directly between the source and drain electrodes that corresponds to the semiconductor channel.

A first surface of the alignment layer directly contacts the semiconducting layer. Without being bound by theory, it is believed that the alignment treatment induces macroscopic alignment of the small molecule semiconductor material in the semiconducting layer, and may also reduce grain boundaries in the semiconducting layer. These effects can enhance charge carrier mobility.

The alignment layer may be formed from any suitable material. In embodiments, the alignment layer is formed from a polyimide, poly(vinyl cinnamate), a styrene-based polymer, an azobenzene polymer, compounds comprising a cinnamate group or an azobenzene group, or the like. A cinnamate group has the structure $C_6H_5$—CH═CH—COO—. An azobenzene group contains an azo group (—N═N—) with each nitrogen atom being bonded to a phenyl group, the azobenzene group attaching to another atom through one of the phenyl groups.

In other embodiments, the alignment layer is formed from an organosilane agent of Formula (A):

$$(L)_t\text{-}[SiR_m(R')_{4-m-t}]_v \quad \text{Formula (A)}$$

wherein R is alkyl or aryl; R' is halogen or alkoxy; m is an integer from 1 to 4; L is a linking atom; t is 0 or 1, and indicates whether a linking atom is present; and v indicates the number of trisubstitutedsilyl groups on the linking atom. The sum of (m+t) is never greater than 4. When t is 0, v is automatically 1. Exemplary organosilane agents of Formula (A) include hexamethyldisilazane (HMDS) (L═NH, t═1, R=methyl, m=3, v=2) and octyltrichlorosilane (OTS-8) (t=0, R=octyl, m=1, R'=chloro, v=1). Other exemplary organosilane agents include dodecyltrichlorosilane, phenyltrichlorosilane, methyltrimethoxylsilane, phenylmethyldimethoxysilane, phenylmethyldichlorosilane, phenyltrimethoxysilane, and the like.

Figure 6:
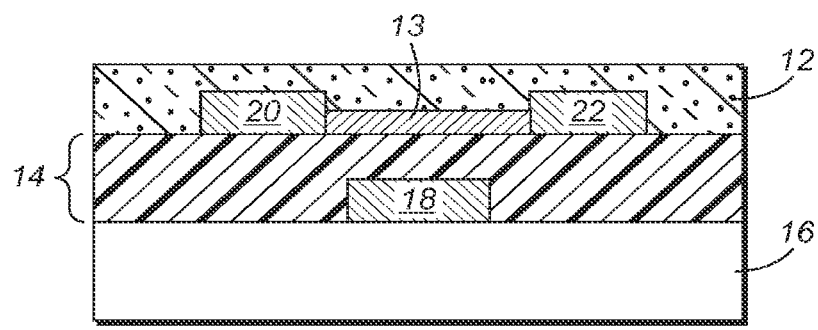
FIG. 6 is a diagram showing a fifth embodiment of a TFT according to the present disclosure.

The alignment layer has a thickness or depth of from about 0.2 nanometers (for example, a self-assembled monolayer) to about 1 micrometers, including from about 0.2 nanometers to about 500 nanometers. The alignment layer can be formed using methods known in the art for the particular material, for example spin coating, dip coating, vapor evaporation, self-assembling, chemically grafting from the dielectric or substrate surfaces, and the like. It should be noted that the alignment layer is shown, for example in FIG. 1 as being an entire layer 13 that separates the dielectric layer 14 from the semiconducting layer 12. This type of construction may be easier for manufacturing purposes. However, the alignment effect can also be achieved if, as seen for example in FIG. 6, the alignment layer 13 is present only in the channel between the source electrode 20 and the source electrode 22.

The semiconducting layer directly contacts the alignment layer. The semiconducting layer may be formed from a semiconducting composition that comprises a polymer binder and a small molecule semiconductor. A semiconducting layer formed from the composition is very stable in air and has high mobility. These semiconductor compositions are useful for forming layers in electronic devices, such as thin film transistors (TFTs).

The small molecule semiconductor may have the structure of Formula (I):

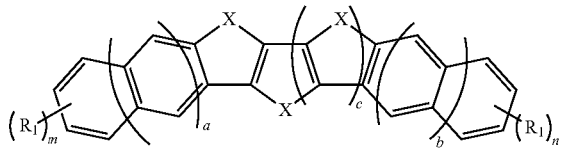

Formula (I)

wherein each $R_1$ is independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano (CN), and halogen; m and n are the number of $R_1$ sidechains on their respective phenyl or naphthyl ring, and are independently an integer from 0 to 6; X is selected from the group consisting of O, S, and Se; and a, b, and c are independently 0 or 1. In this regard, when a or b is 0, the exterior portion of the compound will be a phenyl ring that may have up to 4 sidechains. When a or b is 1, the exterior portion of the compound will be a naphthyl ring that may have up to 6 sidechains.

The term "alkyl" refers to a radical composed entirely of carbon atoms and hydrogen atoms which is fully saturated and of the formula $-C_nH_{2n+1}$. The alkyl radical may be linear, branched, or cyclic.

The term "alkenyl" refers to a radical composed entirely of carbon atoms and hydrogen atoms which contains at least one carbon-carbon double bond that is not part of an aryl or heteroaryl structure. The radical may be linear, branched, or cyclic.

The term "alkynyl" refers to a radical composed entirely of carbon atoms and hydrogen atoms which contains at least one carbon-carbon triple bond. The alkynyl radical may be linear, branched, or cyclic.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms).

The term "heteroaryl" refers to an aromatic radical composed of carbon atoms, hydrogen atoms, and one or more heteroatoms. The carbon atoms and the heteroatoms are present in a cyclic ring or backbone of the radical. The heteroatoms are selected from O, S, and N. Exemplary heteroaryl radicals include thienyl and pyridinyl.

The term "alkoxy" refers to an alkyl radical which is attached to an oxygen atom, i.e. $-O-C_nH_{2n+1}$.

The term "alkylthio" refers to an alkyl radical which is attached to a sulfur atom, i.e. $-S-C_nH_{2n+1}$.

The term "trialkylsilyl" refers to a radical composed of a tetravalent silicon atom having three alkyl radicals attached to the silicon atom, i.e. $-Si(R)_3$. The three alkyl radicals may be the same or different.

The term "ketonyl" refers to a radical having a carbon atom double-bonded to an oxygen atom and single bonded to an alkyl or substituted alkyl group, i.e. $-(C=O)-R$. An exemplary ketonyl radical is methylcarbonyl ($-COCH_3$).

The term "substituted" refers to at least one hydrogen atom on the named radical being substituted with another functional group, such as halogen, $-CN$, $-NO_2$, $-COOH$, and $-SO_3H$. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl or heteroaryl group may also be substituted with alkyl or alkoxy. Exemplary substituted aryl groups include methylphenyl and methoxyphenyl. Exemplary substituted heteroaryl groups include dodecylthienyl.

Generally, the alkyl and alkoxy groups each independently contain from 1 to 30 carbon atoms, including from about 4 to about 16 carbon atoms. Similarly, the aryl groups independently contain from 6 to 30 carbon atoms.

When a, b, and c are 0, X is sulfur, and m and n are each 1, the molecule of Formula (I) is also formally known as a disubstituted-[1]benzothieno[3,2-b]benzothiophene. The [1]benzothieno[3,2-b]benzothiophene moiety (when m and n are each 0) may be abbreviated herein as "BTBT". For example, the semiconductor of Formula (I) could be referred to as a disubstituted-BTBT.

In embodiments, the small molecule semiconductor has a band gap of from about 1.5 to about 3.5 eV, including from about 1.8 to about 2.8 eV. This large band gap typically means that the small molecule semiconductor has better stability in air, when compared to a pentacene-based semiconductor. The small molecule semiconductor has a crystalline or liquid crystalline structure. In specific embodiments, the semiconductor of Formula (I) is colorless in the visible region of the electromagnetic spectrum (i.e. from 390 nm to 750 nm). Colorless semiconductors not only provide excellent stability due to their large band gaps, but also offer advantage in transparency for transparent device applications.

In some specific embodiments of Formula (I), a, b, and c are 0, and each X is sulfur.

Five particular variations of the compound of Formula (I) are contemplated by the present disclosure. In one variation, the small molecule semiconductor has the structure of Formula (II):

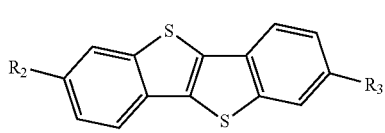

Formula (II)

wherein $R_2$ and $R_3$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen. On this semiconductor compound of Formula (II), $R_2$ is located at the 2-position and $R_3$ is located at the 7-position. Thus, the compound of Formula (II) could be referred to as a 2,7-disubstituted-BTBT. Referring to Formula (I), the compound of Formula (II) is obtained when a, b, and c are 0.

In some embodiments, the $R_2$ and $R_3$ are independently selected from alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen. In some other embodiments, $R_2$ and $R_3$ are independently selected from alkyl and substituted alkyl, and the small molecule semiconductor is combined with specific polymer binders to achieve high field-effect mobility. The polymer binders will be explained further herein. The alkyl group may contain from about 4 to about 30 carbon atoms, including from about 4 to about 16 carbon atoms. Exemplary alkyl groups include butyl, pentyl, hexyl, heptyl, octyl, decyl, dodecyl, tridecyl, hexadecyl, and the like. In some embodiments, the alkyl group has an odd number of carbon atoms; in other embodiments the alkyl group has an even number of carbon atoms. In particular embodiments, $R_2$ and $R_3$ are the same.

In another variation, the small molecule semiconductor has the structure of Formula (III):

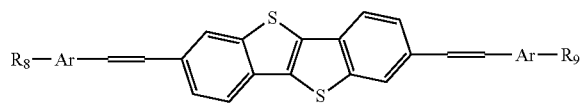

Formula (III)

wherein $R_8$, and $R_9$ are independently alkyl or substituted alkyl; and each Ar is independently an arylene or heteroarylene group. Referring again to Formula (I), the compound of Formula (III) is obtained when a, b, and c are 0; m and n are 1; and each $R_1$ is alkenyl or substituted alkenyl. The alkyl group may contain from 1 to about 30 carbon atoms, including from about 4 to about 18 carbon atoms.

The term "arylene" refers to an aromatic radical composed entirely of carbon atoms and hydrogen atoms that can form single bonds with two different atoms. An exemplary arylene group is phenylene ($-C_6H_4-$).

The term "heteroarylene" refers to an aromatic radical composed of carbon atoms, hydrogen atoms, and one or more heteroatoms, and that can form single bonds with two different atoms. The carbon atoms and the heteroatoms are present in a cyclic ring or backbone of the radical. The heteroatoms are selected from O, S, and N. An exemplary heteroarylene group is 2,5-thienyl.

In a third variation, the small molecule semiconductor has the structure of Formula (IV):

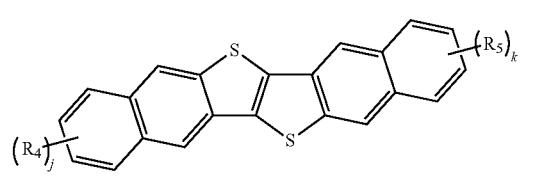

Formula (IV)

wherein $R_4$ and $R_5$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; and j and k are independently an integer from 0 to 6. Referring again to Formula (I), the compound of Formula (IV) is obtained when a and b are both 1, and c is 0. The $R_4$ and $R_5$ sidechains may be located on any carbon atom of the exterior naphthyl portions of the compound of Formula (IV).

In specific embodiments of Formula (IV), $R_4$ and $R_5$ are independently alkyl, j is 1, and k is 1.

In the next variation, the small molecule semiconductor has the structure of Formula (V):

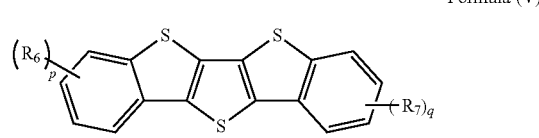

Formula (V)

wherein $R_6$ and $R_7$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; and p and q are independently an integer from 0 to 4. Referring again to Formula (I), the compound of Formula (V) is obtained when a and b are both 0, and c is 1.

In the final variation, the small molecule semiconductor has the structure of Formula (VI):

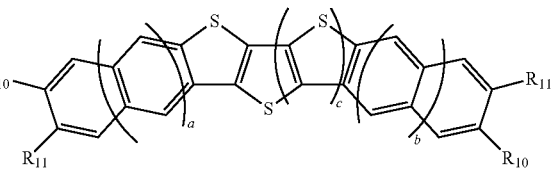

Formula (VI)

wherein $R_{10}$ and $R_{11}$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; and a, b, and c are independently 0 or 1.

In particular embodiments of Formula (VI), $R_{10}$ is halogen or cyano, and $R_{11}$ is alkyl, substituted alkyl, alkenyl, substituted alkenyl, or ketonyl. In other embodiments, $R_{11}$ is halogen or cyano, and $R_{10}$ is alkyl, substituted alkyl, alkenyl, substituted alkenyl, or ketonyl.

Other specific variations on the small molecule semiconductor of Formula (I) are also shown here as Formulas (1)-(50):

Formula (1)
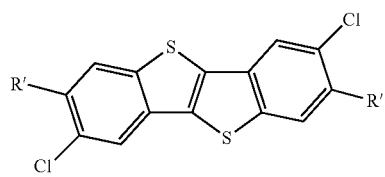
Formula (2)
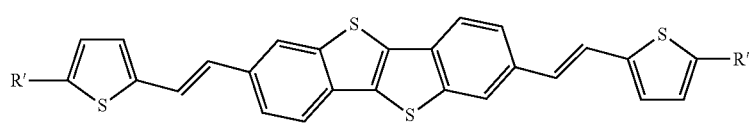
Formula (3)
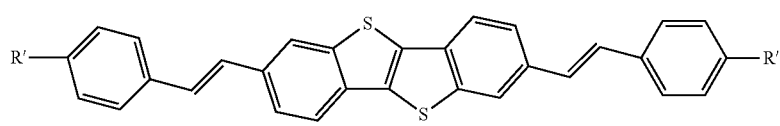
Formula (4)
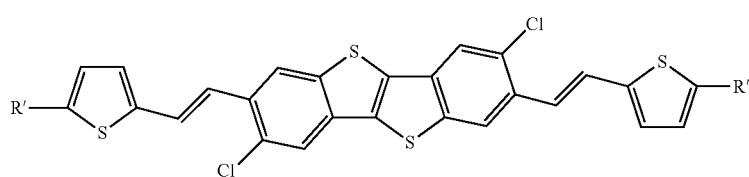
Formula (5)
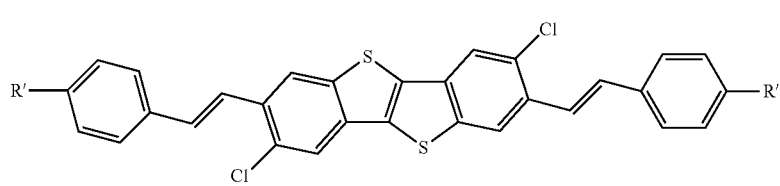
Formula (6)
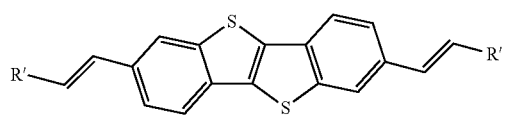
Formula (7)
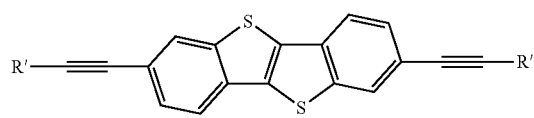
Formula (8)
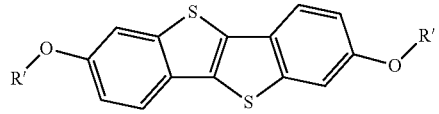
Formula (9)
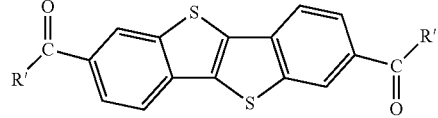
Formula (10)
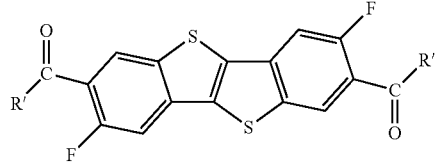
Formula (11)
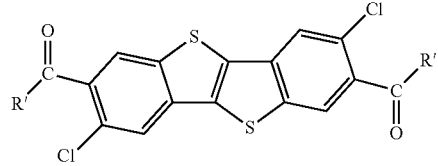
Formula (12)
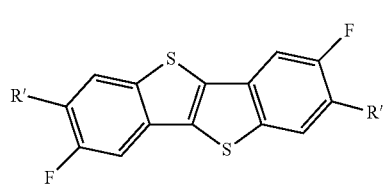
Formula (13)
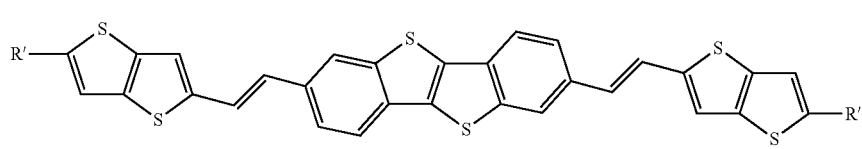

-continued
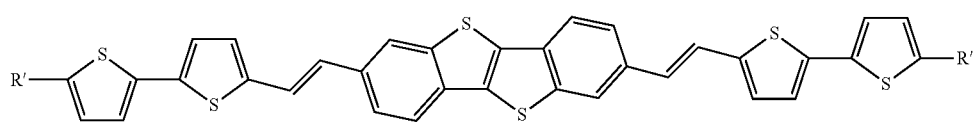
Formula (14)
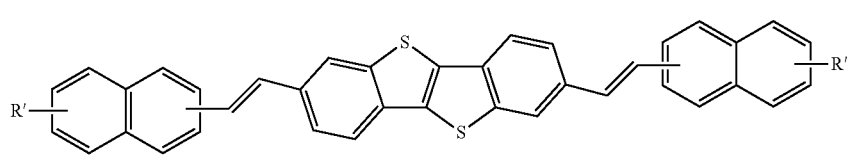
Formula (15)
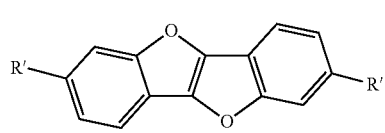
Formula (16)
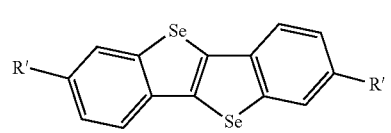
Formula (17)
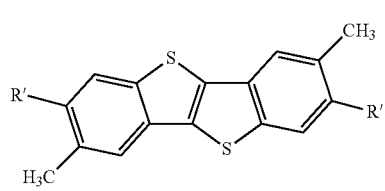
Formula (18)
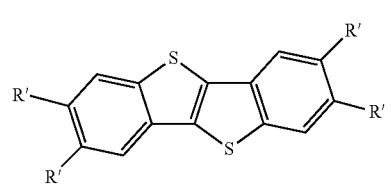
Formula (19)
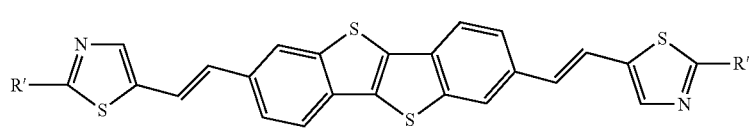
Formula (20)
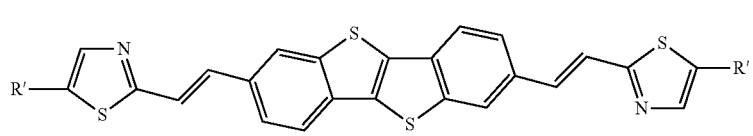
Formula (21)
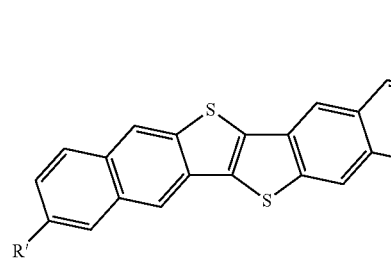
Formula (22)
Formula (23)
Formula (24)
Formula (25)
Formula (26)
Formula (27)

-continued
Formula (28)
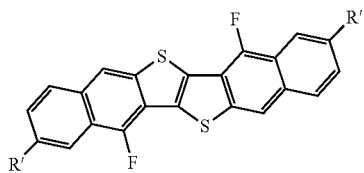
Formula (29)
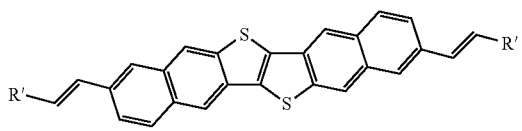
Formula (30)
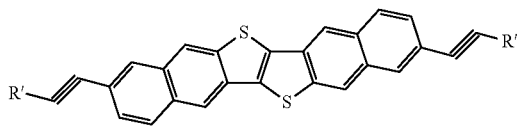
Formula (31)
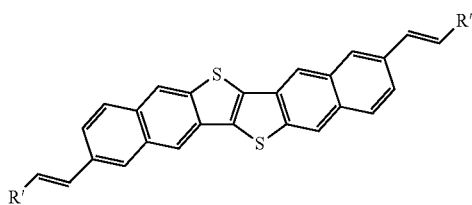
Formula (32)
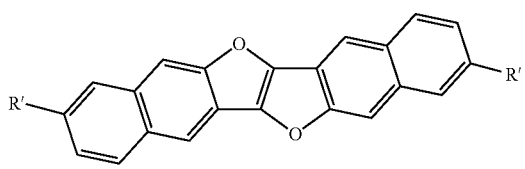
Formula (33)
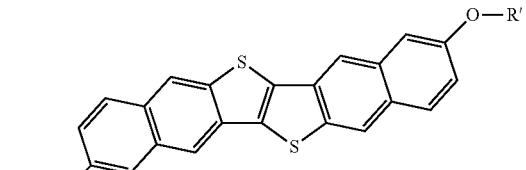
Formula (34)
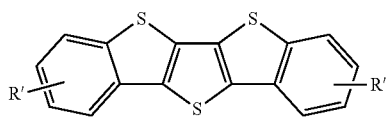
Formula (35)
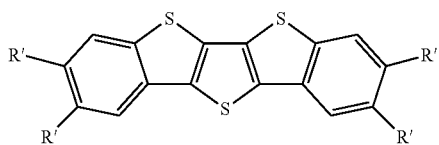
Formula (36)
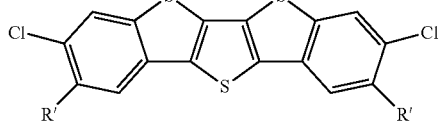
Fromula (37)
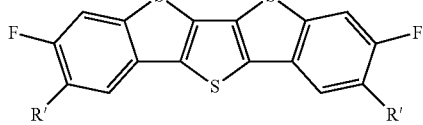
Formula (38)
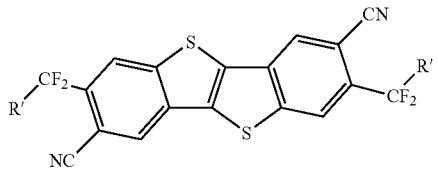
Formula (39)
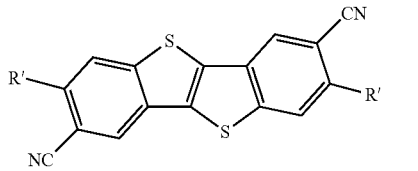
Formula (40)
Formula (41)
Formula (42)
Formula (43)

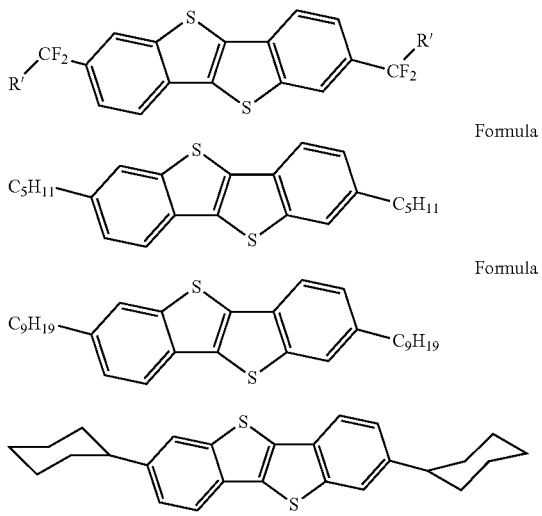
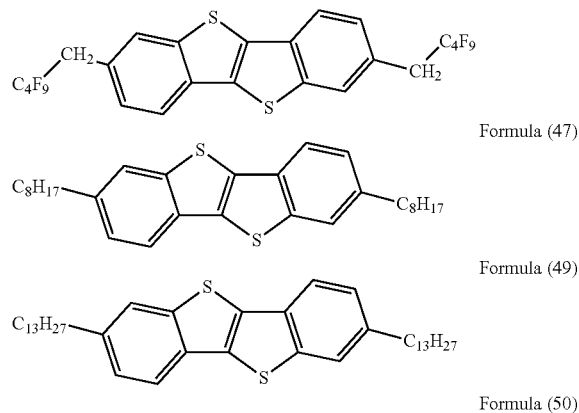

wherein each R' is independently alkyl or substituted alkyl containing from about 4 to about 20 carbon atoms, including from about 4 to about 16 carbon atoms.

The semiconducting compounds of Formulas (2), (3), (7), (8), (9), (13), (14), (15), (20), (21), and (43) through (50) are also exemplary compounds of Formula (II).

The semiconducting compounds of Formulas (2), (3), (13), (14), (15), (20), and (21) are also exemplary compounds of Formula (III).

The semiconducting compounds of Formulas (22), (23), (24), (25), (26), (27), (28), (29), (30), (31), (34), and (35) are also exemplary compounds of Formula (IV).

The semiconducting compounds of Formulas (36), (37), (38), (39), and (40) are also exemplary compounds of Formula (V).

The semiconducting compounds of Formulas (4), (5), (10), (11), (12), (18), (19), (24), (25), (26), (27), (37), (38), (39), (41), and (42) are also exemplary compounds of Formula (VI).

Various methods known in the arts can be used to make the small molecule semiconductors described herein. For example, methods of producing the small molecule semiconductor of Formula (II) include reacting a 2,7-dihalo-BTBT A with an alkyne to form a 2,7-dialkyn-1-yl-BTBT 1. This initial reaction is illustrated below:

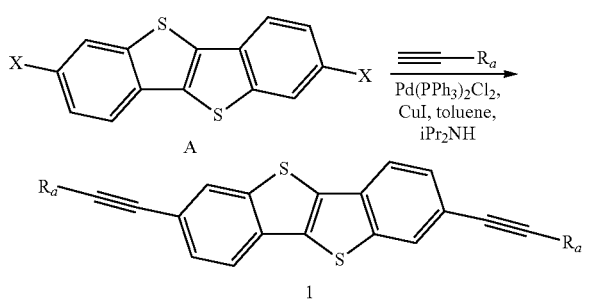

wherein X is a halogen, $R_a$ is alkyl, Ph(PPh$_3$)$_2$Cl$_2$ is bis(triphenylphosphine) palladium(II) chloride, CuI is copper iodide, and iPr$_2$NH is diisopropylamine. As shown here, the two $R_a$ groups are identical. However, the two $R_a$ groups can be different as well, for example by using a blocking/protecting group on one of the X groups, performing a first reaction with a first alkyne to convert the unprotected X group, removing the blocking/protecting group, then subsequently performing a second reaction with a second different alkyne.

Next, the 2,7-dialkyn-1-yl-BTBT 1 can be reduced to a 2,7-dialkyl-[1]benzothieno[3,2-b]benzothiophene 1a as depicted below:

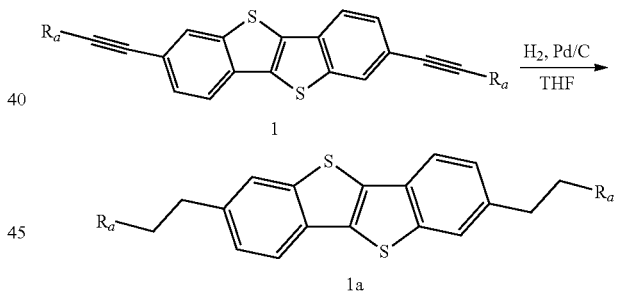

wherein Pd/C is a palladium on carbon catalyst and THF is tetrahydrofuran. Similar reactions can be performed for the other possible $R_a$ substituents.

Methods for preparing compounds 1a also includes the reaction of the [1]benzothieno[3,2-b]-benzothiophene core B with a substituted acid chloride in presence of aluminum trichloride to form a 2,7-diketonyl BTBT 2.

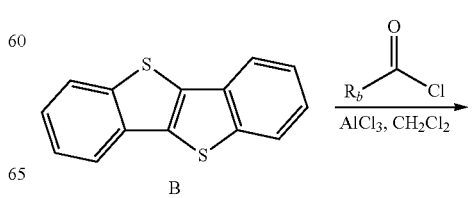

-continued

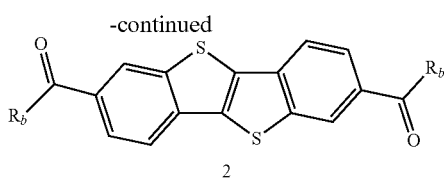

2

Next, the diketonyl BTBT 2 is deoxygenated using a modified Wolff-Kishner reduction using hydrazine in the presence of potassium hydroxide in diethylene glycol. This forms 2,7-dialkyl-[1]benzothieno[3,2-b]benzothiophene 1b.

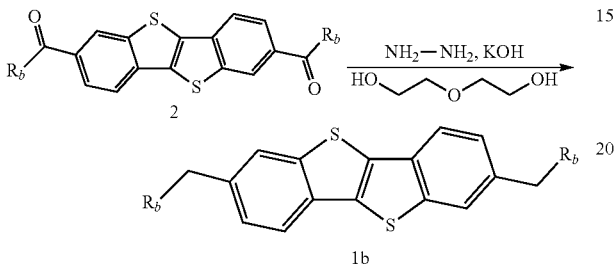

This 2-step method is particularly effective for short $R_b$ substituents ($C_2$-$C_8$).

The small molecule semiconductor by itself has poor film-forming properties, which is attributed to its crystalline or liquid crystalline nature. Thus, the semiconductor composition also comprises a polymer binder, which allows a uniform film to be achieved, significantly improving device performance. The polymer binder can be considered as forming a matrix within which the small molecule semiconductor is dispersed.

Any suitable polymer can be used as the polymer binder for the semiconductor composition. In some embodiments, the polymer is an amorphous polymer. The amorphous polymer may have a glass transition temperature less than the melting point temperature of the small molecule semiconductor. In other embodiments, the amorphous polymer has a glass transition temperature greater than the melting point temperature of the small molecule semiconductor. In embodiments, the polymer has a dielectric constant less than 4.5, preferably less than 3.5, including less than 3.0, as measured at 60 Hz at room temperature. In embodiments, the polymer is selected from polymers containing only C, H, F, Cl, or N atoms. In some embodiments, the polymer is a low polarity polymer, such as a hydrocarbon polymer or a fluorocarbon polymer without any polar groups. For example, polystyrene is an amorphous polymer and has a dielectric constant about 2.6. A list of other low polarity polymers includes but is not limited to the following: fluoropolyarylether, poly(p-xylylene), poly(vinyl toluene), poly(α-methyl styrene), poly(α-vinylnaphthalene), polyethylene, polypropylene, polyisoprene, poly(tetrafluoroethylene), poly(chlorotrifluoroethylene), poly(2-methyl-1,3-butadiene), poly(cyclohexyl methacrylate), poly(chlorostyrene), poly(4-methyl styrene), poly(vinyl, cyclohexane), polyphenylene, poly-p-phenylvinylidenes, poly(arylene ether), polyisobutylene, poly(2,6-dimethyl-1,4-phenylene ether), poly[1,1-(2-methyl propane)bis-(4-phenyl)carbonate], poly(a-a-a'-a' tetrafluoro-p-xylylene), fluorinated polyimide, poly(ethylene/tetrafluoroethylene), poly(ethylene/chlorotrifluoroethylene), fluorinated ethylene/propylene copolymer, poly(styrene-co-a-methyl styrene), poly(styrene/butadiene), poly(styrene/2,4-dimethylstyrene), CYTOP, poly (propylene-co-1-butene), poly(styrene-co-vinyl toluene), poly(styrene-block-butadiene-block-styrene), poly(styrene-block-isoprene-block-styrene), terpene resin, poly(N-vinylcarbazole), polycarbazole, polytriarylamine, and the like.

It has been found that the mobility of the semiconducting layer formed by the semiconductor composition can be affected by the combination of small molecule semiconductor with certain polymers. The compounds of Formula (I) can be combined with many different polymers. In some particular embodiments, the polymer binder is a styrene-based polymer.

Styrene-based polymers contain a repeating unit derived from a styrene monomer of Formula (a):

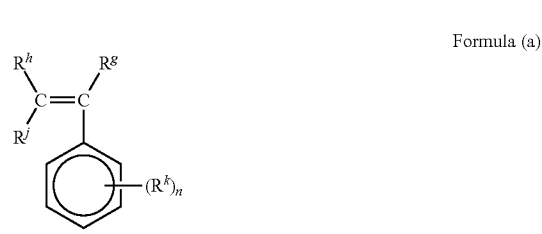

Formula (a)

wherein $R^g$, $R^h$, $R^j$ and $R^k$ are independently selected from hydrogen, halogen, and $C_1$-$C_{20}$ alkyl; and n is an integer from 0 to 5. The styrene monomer can be styrene ($R^g$, $R^h$, and $R^j$ are all hydrogen, n=0), alpha-methyl styrene ($R^g$ is methyl, $R^h$ and $R^j$ are hydrogen, n=0), or 4-methyl styrene ($R^g$, $R^h$, and $R^j$ are all hydrogen, n=1, $R^k$ is methyl in the 4-position). The term "styrene-based polymer" is intended to encompass both homopolymers and copolymers. The term "copolymer" is intended to encompass random, alternative, and block copolymers.

In other particular embodiments, the polymer binder is an arylamine-based polymer. An arylamine-based polymer has a repeating unit derived from a monomer having the structure of Formula (b), Formula (c) or Formula (d):

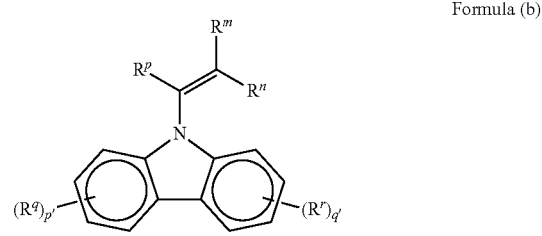

Formula (b)

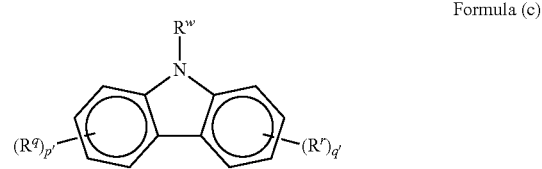

Formula (c)

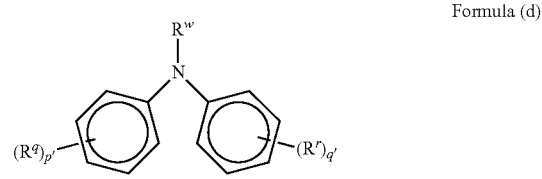

Formula (d)

wherein $R^m$, $R^n$, $R^p$, $R^q$, and $R^r$ are independently selected from hydrogen, halogen, $C_1$-$C_{20}$ alkyl, and aryl; p' and q' are independently an integer from 0 to 5; and $R^w$ is selected from $C_1$-$C_{20}$ alkyl, aryl, and substituted aryl. The term "arylamine-based" polymers is intended to encompass poly(N-vinyl carbazole), polycarbazole, and triarylamine-based polymers.

In specific embodiments, the styrene-based polymer and the arylamine-based polymer include polystyrene, poly($\alpha$-methyl styrene), poly(4-methyl styrene), poly(vinyl toluene), poly($\alpha$-methyl styrene-co-vinyl toluene), poly(styrene-block-butadiene-block-styrene), poly(styrene-block-isoprene-block-styrene), a terpene resin, poly(styrene-co-2,4-dimethylstyrene), poly(chlorostyrene), poly(styrene-co-$\alpha$-methyl styrene), poly(styrene/butadiene), poly(N-vinylcarbazole), polycarbazole, and polytriarylamines. It should be noted that one or more polymer binders can be used in the semiconductor composition.

The compound of Formula (II) works best when combined with the polymer binders discussed above, particularly, the styrene-based polymer or the arylamine-based polymer described above.

In more specific embodiments, the polymer binder is a styrene-based polymer. In particular embodiments, the styrene-based polymer has a weight average molecular weight of from about 40,000 to about 2,000,000. In some embodiments, the styrene-based polymer has a molecular weight of from about 100,000 to about 1,000,000. In one preferred embodiment, the polymer binder is polystyrene, poly(alpha-methyl styrene), or poly(4-methyl styrene) having a weight average molecular weight of from about 40,000 to about 2,000,000.

The compounds of Formulas (III), (IV), (V), and (VI) can generally be combined with any polymer binder. Exemplary polymer binders include the polymer binders discussed above, and other polymers such as poly(vinyl cinnamate), polysiloxanes, polypyrroles, polyacrylates, polymethacrylates, polyesters, and mixtures thereof. The polymers may have a weight average molecular weight of from about 10,000 to about 2,000,000, including from about 40,000 to about 1,000,000.

The weight ratio of the small molecule semiconductor of Formula (I) to the polymer binder may be from about 99:1 to about 1:3, including from about 10:1 to about 1:2, from about 5:1 to about 2:3, or from about 3:2 to about 3:4. In some embodiments, the weight ratio of the small molecule semiconductor of Formula (I) to the polymer binder is around 1:1. The weight ratio of the small molecule semiconductor of Formula (II) to the styrene-based polymer binder is desirably from about 3:2 to about 2:3, and works optimally at a ratio of about 1:1.

The semiconductor composition may further comprise a solvent in which the small molecule semiconductor and the polymer binder are soluble. Exemplary solvents used in the solution may include chlorinated solvents such as chlorobenzene, chlorotoluene, dichlorobenzene, dichloroethane, chloroform, trichlorobenzene, and the like; alcohols and diols such as propanol, butanol, hexanol, hexanediol, etc.; hydrocarbons or aromatic hydrocarbons such as hexane, heptane, toluene, decalin, xylene, ethyl benzene, tetrahydronaphthalene, methyl nanphthalene, mesitylene, trimethyl benzene, etc.; ketones such as acetone, methyl ethyl ketone, etc.; acetates, such as ethyl acetate; pyridine, tetrahydrofuran, and the like.

The small molecule semiconductor and the polymer binder are from about 0.05 to about 20 weight percent of the semiconductor composition, including from about 0.1 to about 10 weight percent of the semiconductor composition, or from about 0.1 to about 1.0 weight percent of the semiconductor composition.

In embodiments, the semiconductor composition comprising the small molecule semiconductor and the polymer binder may have a viscosity of from about 1.5 centipoise (cps) to about 100 cps, including from about 2 to about 20 cps. The use of a high molecular weight polymer binder will increase the viscosity of the semiconductor composition. As a result, it will help to form a uniform semiconductor layer upon using solution deposition techniques such as inkjet printing and spin coating.

Bottom-gate TFTs may be advantageous because they are generally simpler to fabricate. However, previous semiconductor/polymer composite systems have only achieved high mobility in top-gate devices. When the semiconductor composition of the present disclosure is utilized, high mobility can also be achieved in bottom-gate devices like those shown in FIGS. 1-3.

The semiconducting layer may be formed in an electronic device using conventional processes known in the art. In embodiments, the semiconducting layer is formed using solution depositing techniques. Exemplary solution depositing techniques include spin coating, blade coating, rod coating, dip coating, screen printing, ink jet printing, stamping, stencil printing, screen printing, gravure printing, flexography printing, and the like.

After being deposited, the semiconductor composition is optionally thermally treated (for example, by drying or annealing) at an elevated temperature which is lower than the melting point of the small molecule semiconductor used in the semiconductor composition. Depending on the small molecule semiconductor used, the temperature of the thermal treatment may vary. For example, the thermal treatment may be carried out at a temperature of less than 200° C., less than 150° C., or less than 100° C. Generally, the semiconductor layer will not undergo a thermal treatment process having a temperature higher than the melting point of the small molecule semiconductor. In some embodiments, particularly those which use the small molecule semiconductor of Formula (I), there is absent of an annealing step during the fabrication of a semiconductor layer from the semiconductor composition. Annealing at a temperature higher than the melting point of the small molecule semiconductor would cause significant phase separation of the small molecule semiconductor and the polymer binder, as well as increasing the average crystal size of the small molecule semiconductor. As a result, the electronic device would show poor electrical performance.

In the bottom-gate and top-gate embodiments shown in FIGS. 1-4, the alignment layer is laid down before the semiconducting layer. The alignment treatment can be performed on the surface of the alignment layer before the source electrode, drain electrode, and semiconducting layer are deposited. In the top-gate embodiment of FIG. 4, the gate dielectric layer and the gate electrode are subsequently deposited upon the semiconducting layer.

In some embodiments, the small molecule semiconductor is a liquid crystalline material, or in other words the semiconductor is a liquid crystalline compound (e.g. showing at least a liquid crystalline phase such as nematic or smectic phase) at an elevated temperature. Annealing would help to achieve macroscopic alignment of the small molecule semiconductor upon an alignment layer. In embodiments, the annealing is conducted at a temperature below the liquid crystal phase-isotropic phase transition temperature of the small molecule semiconductor. In some embodiments, annealing is performed at a temperature higher than the crystal-liquid crystal phase transition temperature of the small molecule semiconductor. In other embodiments, annealing is performed at a temperature below the crystal-liquid crystal phase transition temperature.

In particular embodiments, the small molecule semiconductor is crystalline, particularly at room temperature, and has an average crystal size in the semiconducting layer of 100 nanometers or less. In specific embodiments, the average crystal size is 50 nanometers or less. In more specific embodiments, the average crystal size is 35 nanometers or less. The crystalline small molecule semiconductor generally has a crystal size greater than 5 nanometers. The average crystal size can be measured using methods such as X-ray diffraction, transmission electron microscopy (TEM), scanning electron microscopy (SEM), atomic force microscopy (AFM), etc. The measurement of the average crystal size is expressed as the diameter of a spherical volume. However, this should not be construed as requiring the crystals of the small molecule semiconductor to have a particular morphology or shape.

The semiconducting layer formed using the semiconductor composition can be from about 5 nanometers to about 1000 nanometers deep, including from about 20 to about 100 nanometers in depth. In certain configurations, such as the configurations shown in FIG. 1, the semiconducting layer completely covers the source and drain electrodes.

The performance of a TFT can be measured by mobility. The mobility is measured in units of $cm^2/V \cdot sec$; higher mobility is desired. The resulting TFT including the alignment layer and semiconducting layer of the present disclosure may have a field effect mobility of at least $0.8\ cm^2/V \cdot sec$, including at least $0.9\ cm^2/V \cdot sec$, or at least $1.0\ cm^2/V \cdot sec$. The TFT of the present disclosure may have a current on/off ratio of at least $10^5$, including at least $10^6$.

The thin film transistor generally also includes a substrate, an optional gate electrode, source electrode, drain electrode, and a dielectric layer in addition to the alignment layer and the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconductor layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Comparative Example 1

An n-doped silicon wafer was provided as a substrate. A silicon oxide dielectric layer was thermally grown on the wafer. The dielectric layer was grown to a thickness of 200 nm. The surface of the dielectric layer was modified with hexamethyldisilazane (HMDS). The HMDS layer was about 0.3 nm thick.

A semiconductor solution was formed by dissolving 15 mg of polystyrene and 15 mg of 2,7-ditridecyl[1]benzothieno[3,2-b]benzothiophene into 2 grams of chlorobenzene solvent. The semiconductor solution was spin coated on the modified substrate to form a uniform film. The film was dried for 30 minutes at 70-80° C. to form the semiconducting layer. Gold source and drain electrodes were vacuum evaporated on top of the semiconducting layer to finish the device. Several devices were made.

Comparative Example 2

Devices were formed as described in Comparative Example 1. However, the surface of the dielectric layer was modified with octyltrichlorosilane (OTS-8) instead. The OTS-8 layer was about 0.7 nm thick.

Testing of Comparative Examples

The transistors formed in the two Comparative Examples were characterized with a KEITHLEY® 4200 Semiconductor Characterization System at ambient conditions. At least 10 devices were evaluated. The highest mobility measured was 0.77 cm²/V·s. The average mobility of the devices was about 0.48 cm²/V·sec for the devices of Comparative Example 1 (HMDS-modified), and about 0.53 cm²/V·sec for the devices of Comparative Example 2 (OTS-8 modified).

Example 1

An n-doped silicon wafer was provided as a substrate. A silicon oxide dielectric layer was thermally grown on the wafer. The dielectric layer was grown to a thickness of 200 nm. The surface of the dielectric layer was modified with OTS-8. The OTS-8 layer was about 0.7 nm thick. The OTS-8 layer was then gently rubbed in one direction with velvet cloth in a rubbing machine at 1000 rpm.

A semiconductor solution was formed by dissolving 15 mg of polystyrene and 15 mg of 2,7-ditridecyl[1]benzothieno[3,2-b]benzothiophene into 2 grams of chlorobenzene solvent. The semiconductor solution was spin coated on the modified substrate to form a uniform film. The film was dried for 30 minutes at 70-80° C. to form the semiconducting layer.

Gold source and drain electrodes were vacuum evaporated on top of the semiconducting layer so that the channel length was along the rubbing direction. Several devices were made.

The transistors were characterized with a KEITHLEY® 4200 Semiconductor Characterization System at ambient conditions. At least 10 devices were evaluated. The highest mobility measured was 1.5 cm²/V·s. The average mobility of the devices was about 0.9 cm²/V·s. Compared to the Comparative Examples, the average mobility was improved by a factor of about two, as was the highest mobility.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. An electronic device comprising:
    a semiconducting layer comprising a small molecule semiconductor and a polymer binder; and
    an alignment layer in contact with the semiconductor layer;
    wherein the small molecule semiconductor has the structure of Formula (I):

Formula (I)

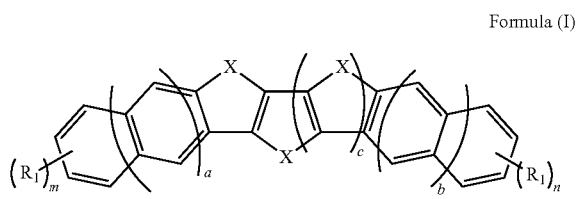

wherein each $R_1$ is independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; m and n are the number of $R_1$ sidechains on their respective phenyl or naphthyl ring, and are independently an integer from 0 to 6; X is selected from the group consisting of O, S, and Se; and a, b, and c are independently 0 or 1; and wherein the small molecule semiconductor has the structure of Formula (III);

Formula (III)

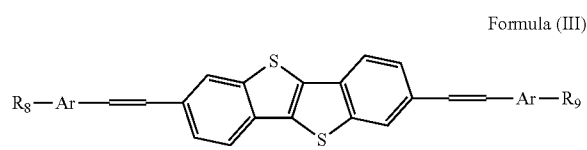

wherein $R_8$, and $R_9$ are independently alkyl or substituted alkyl; and each Ar is independently an arylene or heteroarylene group.

2. An electronic device comprising:
    a semiconducting layer comprising a small molecule semiconductor and a polymer binder; and
    an alignment layer in contact with the semiconductor layer;
    wherein the small molecule semiconductor has the structure of Formula (I):

Formula (I)

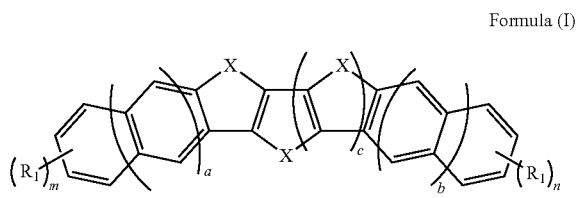

wherein each $R_1$ is independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; m and n are the number of $R_1$ sidechains on their respective phenyl or naphthyl ring, and are independently an integer from 0 to 6; X is selected from the group consisting of O, S, and Se; and a, b, and c are independently 0 or 1; and
wherein the small molecule semiconductor has the structure of Formula (IV):

Formula (IV)

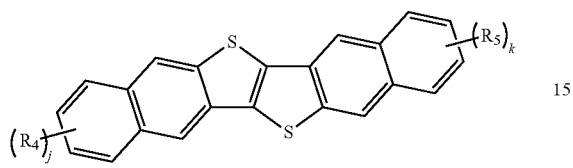

wherein $R_4$ and $R_5$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, ketonyl, cyano, and halogen; and j and k are independently an integer from 0 to 6.

* * * * *